(12) United States Patent
Li et al.

(10) Patent No.: US 8,362,564 B2
(45) Date of Patent: Jan. 29, 2013

(54) ISOLATED EPITAXIAL MODULATION DEVICE

(75) Inventors: Yu Li, San Jose, CA (US); Steven Howard Voldman, South Burlington, VT (US)

(73) Assignee: Intersil Americas Inc., Milpitas, CA (US)

( * ) Notice: Subject to any disclaimer, the term of this patent is extended or adjusted under 35 U.S.C. 154(b) by 92 days.

(21) Appl. No.: 13/050,536

(22) Filed: Mar. 17, 2011

(65) Prior Publication Data

US 2012/0044732 A1 Feb. 23, 2012

Related U.S. Application Data

(60) Provisional application No. 61/424,625, filed on Dec. 18, 2010, provisional application No. 61/375,360, filed on Aug. 20, 2010.

(51) Int. Cl.
*H01L 21/762* (2006.01)

(52) U.S. Cl. ... 257/355; 257/374; 257/506; 257/E29.02; 257/E21.564

(58) Field of Classification Search ............ 257/355, 257/374, 506, E29.02, E21.564, E21.561
See application file for complete search history.

(56) References Cited

U.S. PATENT DOCUMENTS

| | | |
|---|---|---|
| 3,293,087 A | 12/1966 | Porter |
| 3,780,426 A | 12/1973 | Ono et al. |
| 4,503,603 A | 3/1985 | Blossfeld |
| 4,549,193 A | 10/1985 | Malhi et al. |
| 4,673,965 A | 6/1987 | Rusch |
| 5,087,579 A | 2/1992 | Tomassetti |
| 5,399,507 A * | 3/1995 | Sun .............................. 438/152 |
| 5,940,258 A | 8/1999 | Duvvury |
| 5,949,094 A | 9/1999 | Amerasekera |
| 6,030,888 A | 2/2000 | Leonardi |
| 6,034,399 A * | 3/2000 | Brady et al. ................... 257/355 |
| 6,411,480 B1 | 6/2002 | Gauthier et al. |
| 6,452,220 B1 | 9/2002 | Morse et al. |
| 6,465,768 B1 | 10/2002 | Ker et al. |
| 6,469,362 B2 | 10/2002 | Wong et al. |
| 6,475,848 B1 | 11/2002 | Darwish et al. |
| 6,566,715 B1 | 5/2003 | Ker et al. |
| 6,657,835 B2 | 12/2003 | Ker et al. |
| 6,661,273 B1 | 12/2003 | Lai et al. |
| 6,667,865 B2 | 12/2003 | Duvvury et al. |
| 6,693,314 B2 | 2/2004 | Mitlehner et al. |
| 6,724,592 B1 | 4/2004 | Tong et al. |
| 6,727,573 B2 | 4/2004 | Mitani et al. |
| 6,784,065 B1 | 8/2004 | Naem |
| 6,858,901 B2 | 2/2005 | Ker et al. |
| 6,900,969 B2 | 5/2005 | Salling et al. |
| 6,903,913 B2 | 6/2005 | Ker et al. |
| 6,933,567 B2 | 8/2005 | Duvvury et al. |
| 7,042,028 B1 | 5/2006 | Huang et al. |

(Continued)

OTHER PUBLICATIONS

Duvvury et al., "Substrate Pump NMOS for ESD Protection Applications", "Electrical Overstress/Electrostatic Discharge Symposium Proceedings", 2000, pp. 1A.2.1 thru 1A.2.11, Publisher: Texas Instruments, Published in: Anaheim, CA.

*Primary Examiner* — George Fourson, III
(74) *Attorney, Agent, or Firm* — Fogg & Powers LLC

(57) ABSTRACT

An isolated epitaxial modulation device comprises a substrate; a barrier structure formed on the substrate; an isolated epitaxial region formed above the substrate and electrically isolated from the substrate by the barrier structure; a semiconductor device, the semiconductor device located in the isolated epitaxial region; and a modulation network formed on the substrate and electrically coupled to the semiconductor device. The device also comprises a bond pad and a ground pad. The isolated epitaxial region is electrically coupled to at least one of the bond pad and the ground pad. The semiconductor device and the epitaxial modulation network are configured to modulate an input voltage.

16 Claims, 6 Drawing Sheets

U.S. PATENT DOCUMENTS

| | | |
|---|---|---|
| 7,289,307 B2 | 10/2007 | Ker et al. |
| 7,348,643 B2 | 3/2008 | Boselli et al. |
| 7,605,431 B2 * | 10/2009 | Chen .............................. 257/370 |
| 2006/0054892 A1 * | 3/2006 | Hayashi .......................... 257/69 |

* cited by examiner

ISOLATED EPITAXIAL MODULATION DEVICE

CROSS-REFERENCE TO RELATED APPLICATIONS

This application is related to the following co-pending U.S. patent applications, all of which are hereby incorporated herein by reference:

U.S. provisional patent application Ser. No. 61/375,360 entitled "SUBSTRATE PUMP ELECTROSTATIC DISCHARGE DEVICE," filed on Aug. 20, 2010 and referred to herein as the '360 application. The present application hereby claims priority to U.S. Provisional Patent Application No. 61/375,360.

U.S. provisional patent application Ser. No. 61/424,625 entitled "SUBSTRATE PUMP ELECTROSTATIC DISCHARGE DEVICE," filed on Dec. 18, 2010 and referred to herein as the '625 application. The present application hereby claims priority to U.S. Provisional Patent Application No. 61/424,625.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
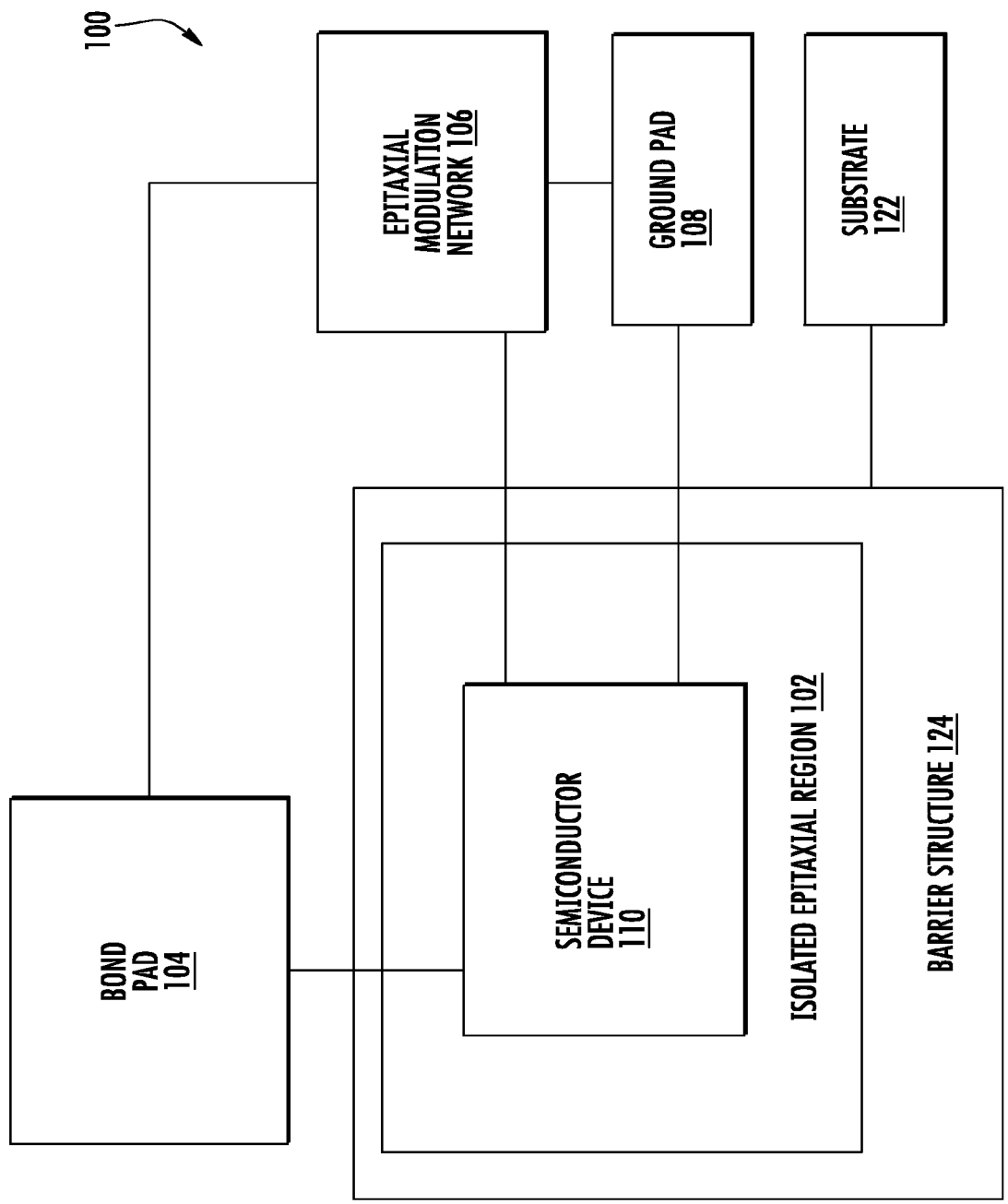
FIG. 1 is a block diagram of one embodiment of an isolated epitaxial modulation device.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be taken in a limiting sense.

FIG. 1 is a block diagram of one embodiment of an isolated epitaxial modulation device 100. The modulation device 100 includes an isolated epitaxial region 102 coupled to a bond pad 104, an epitaxial modulation network 106 and ground pad 108. In the exemplary embodiments described herein, the bond pad 104 is implemented as an input/output (I/O) pad. However, it is to be understood that the bond pad 104 can be implemented differently in other embodiments. For example, the bond pad 104 can be implemented as an input pad, output pad, input/output (I/O) pad, signal pad, test pad, programmable pad, or a power pad (e.g. coupled to Vdd, Vcc, Vee, Vss, etc).

In addition, a semiconductor device 110 is located in the isolated epitaxial region 102. The semiconductor device 110 is coupled to the ground pad 108, epitaxial modulation network 106, and bond pad 104. Exemplary semiconductor devices that can be implemented as semiconductor device 110 include, but are not limited to, a metal oxide semiconductor field-effect transistor (MOSFET), a bipolar junction transistor (BJT), or a laterally diffused metal oxide semiconductor (LDMOS) device. The exemplary semiconductor devices can be implemented in, for example, a complementary metal oxide semiconductor (CMOS) technology, a bipolar junction transistor-CMOS (BiCMOS) technology, a silicon on insulator (SOI) technology, silicon on diamond (SOD), silicon on sapphire (SOS), or a bipolar-CMOS-DMOS (BCD) technology. The exemplary semiconductor devices can be implemented in, but are not limited to, silicon germanium (SiGe), silicon germanium carbon (SiGeC), gallium arsenide (GaAs), gallium nitride (GaN), and other III-V semiconductor technologies.

The semiconductor device 110 and the epitaxial modulation network 106 together modulate an input voltage. Thus, when the bond pad 104 is implemented as a signal pad (e.g. input pad, output pad, or input/output pad) the isolated epitaxial modulation device 100 can be used, for example, to protect an electrical circuit from voltage transients, or current spikes, such as electrostatic discharge (ESD) current, and Electrical overstress (EOS). However, it is to be understood that other uses for the modulation device 100 are also contemplated. For example, when the bond pad 104 is implemented as a power pad, the isolated epitaxial modulation device 100 can be implemented as an ESD power clamp network (e.g. an ESD network between two power pins)

Also included in the modulation device 100 is a substrate 122 and a barrier structure 124. The substrate can be comprised of any suitable material known to one of skill in the art, such as silicon, quartz or other materials. The barrier structure 124 electrically isolates the epitaxial region 102 from the substrate 122. Thus, the electrical potential of the isolated epitaxial region 102 can be modified independently of the substrate 122. For example, in some embodiments, the barrier structure 124 is implemented as a biased buried layer which separates the region 102 from the substrate 122. However, it is to be understood that the barrier structure 124 can implemented differently in other embodiments. For example, in some implementations, the barrier structure 124 is an oxide insulating material. The sides of the barrier structure can be silicon metallurgical junction structure, shallow trench isolation (STI) structure, deep trench (DT) structure, through wafer via (TWV) structure, or through silicon vias (TSV) structure. The shallow trench isolation and deep trench (DT) isolation structure can be filled with an oxide, polyimide, or polysilicon material. In addition, the substrate 122 and the ground pad 108 are not necessarily coupled to the same electrical potential. However, in some embodiments, the substrate 122 is coupled to the same electrical potential as the ground pad 108.

Figure 2:
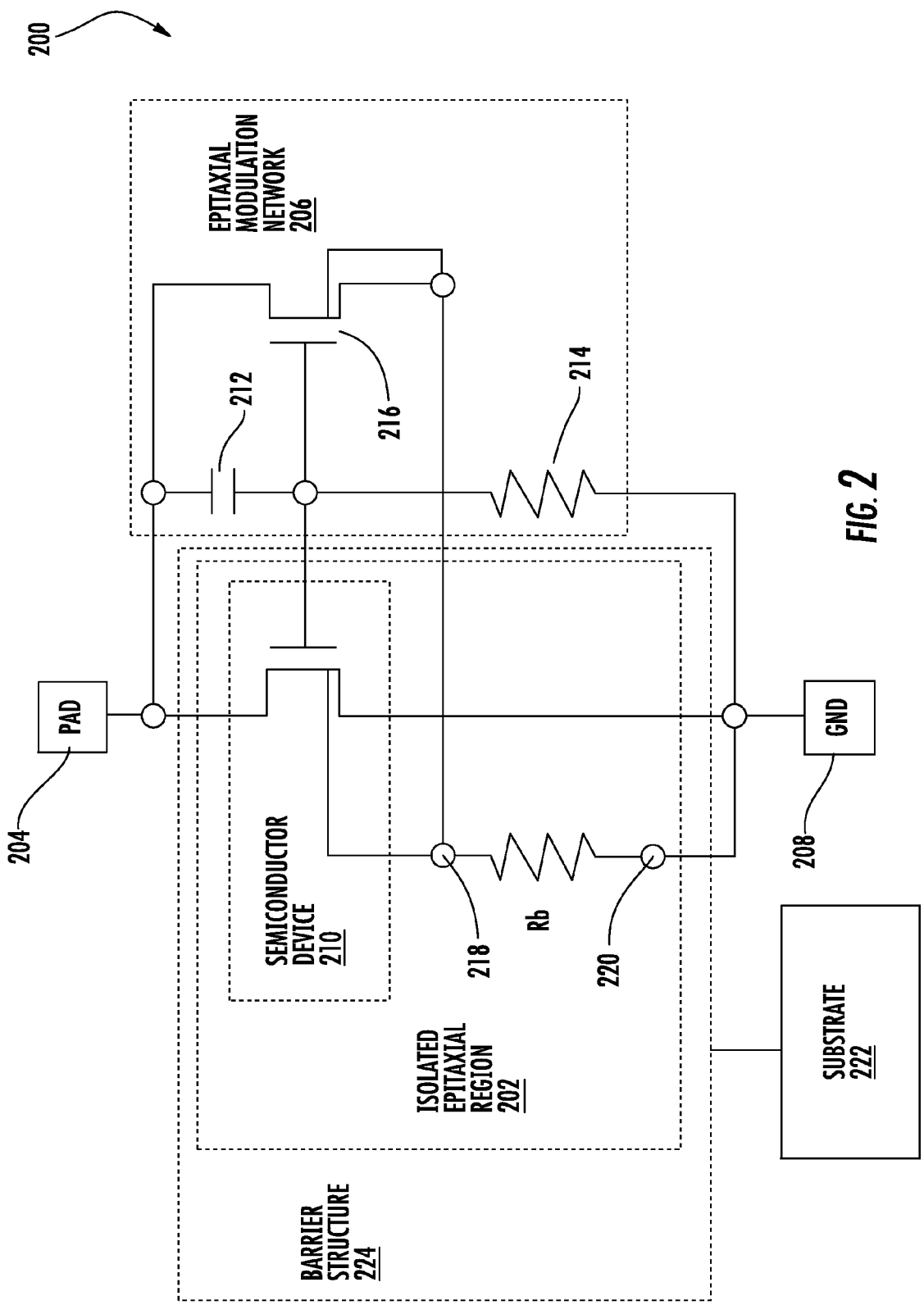
FIG. 2 is a simplified circuit diagram of one embodiment of an isolated epitaxial modulation device.
Figure 3:
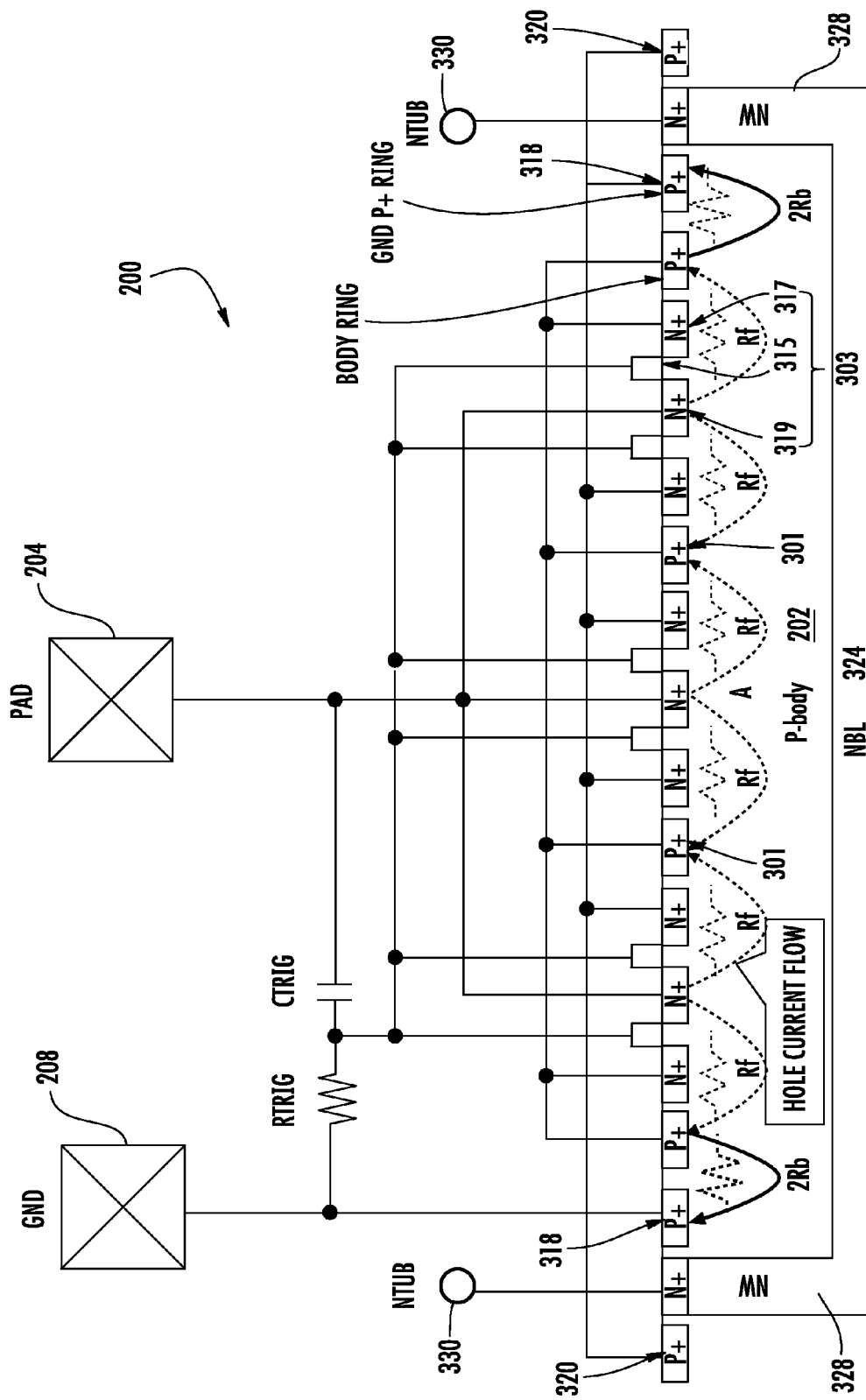
FIG. 3 is a top view of an exemplary isolated epitaxial modulation device.

FIG. 2 is a circuit diagram of one embodiment of an isolated epitaxial modulation device 200. In the embodiment shown in FIG. 2, the modulation device 200 is implemented as a protection device to shunt ESD current. The semiconductor device 210 is implemented as an n-channel metal-oxide semiconductor (NMOS) that is the primary protection device that shunts ESD current. In particular, in this particular embodiment, the NMOS is a multi-finger NMOS. That is, the NMOS is comprised of a plurality of parallel transistors as shown in FIG. 3 and described below.

In addition, in the embodiment shown in FIG. 2, the epitaxial modulation network 206 includes a resistance 212 and a capacitance 214 that form a resistor-capacitor (RC) discriminator. The epitaxial modulation network 206 also includes one or more transistors 216. The one or more transistors 216 are also implemented as an NMOS in this example. The capacitance 214 represents the capacitance between I/O pad 204 and the gate node of semiconductor device 210 and transistor 216. The resistance 212 represents the resistance from the gate of the semiconductor device 210 and transistor 216 to ground (GND) 208. The resistor element can be a silicon resistor, metal resistor, or polysilicon resistor. The capacitor element can be a silicon metallurgical junction, metal-insulator-metal (MIM) capacitor, MOS capacitor, vertical parallel plate (VPP) capacitor, or a vertical natural plate capacitor (VNP).

The isolated epitaxial region 202 is electrically separated from the substrate 222 by the barrier structure 224. The isolated epitaxial region 102 also includes a body ring 218 which is depicted in FIG. 2 as a node. However, the body ring 218 surrounds the semiconductor device 210 as described in more detail below. The body ring 218 also includes ties located between fingers of the semiconductor device 210 having adjacent source regions, as described in more detail below. The effective resistance between the body ring 218 and a P+ ring 220 is labeled as Rb in FIG. 2.

At the onset of an ESD event, the gate potential of the NMOS semiconductor device 210 and the gate potential of transistor 216 rise due to the resistance/capacitance (RC) coupling between I/O pad 204 and GND pad 208. The current conducted by transistor 216 flows through Rb and drives up the potential of the body ring 218. The source of NMOS semiconductor device 210 is tied to GND pad 208 so the body to source junction is forward biased. As a result, the fingers of NMOS semiconductor device 210 are triggered at a relatively lower voltage. In other words, the fingers of NMOS semiconductor device 210 are turned on or begin to shunt current at a relatively lower voltage. The forward bias of the source body junction of NMOS semiconductor device 210 also helps promote uniform turn on of the NMOS fingers. The body potential of NMOS semiconductor device 210 is controlled by the body ring 218 surrounding NMOS semiconductor device 210. Once the fingers are turned on, they begin to shunt the ESD current to protect other components from the ESD current. With the rising of the body region, the current drive of the transistor increases. MOSFET current drive is proportional to the (VG-VT) where VG is the gate voltage, and VT is the threshold voltage. As the body rise, the MOSFET body effect is reduced, leading to a lower threshold voltage. This effect is also referred to as the MOSFET reverse body effect or dynamic threshold MOSFET effect. As the VT is reduced, the current drive, Ids, of the transistor increases, leading to an improvement in the ability to discharge the ESD event.

FIG. 3 is a simplified cross section of the modulation device 200. The isolated modulation device 200 includes a P+ substrate 322, an N+ buried layer 324 overlaying the P+ substrate 322 and an isolated epitaxial region 202 (also labeled and referred to as P-body region) overlaying the N+ buried layer 324. The modulation device 200 also includes an N+ well 328 coupled to the N+ buried layer 324 and enclosing the isolated epitaxial region 202. The N+ buried layer 324 and the N+ well 328 function as the barrier structure in this embodiment to electrically isolate the isolated epitaxial region 202 from the substrate 222. The buried layer 324 is coupled to the ground pad 208, in some embodiments, via the well 328 and NTUB 330. In other embodiments, the buried layer 324 is floated, biased or coupled to a power supply or reference voltage. In the case that the buried layer 324 and N+ well or edge 328 are an insulator structure, biasing can occur if the material in the buried layer 324 is polysilicon. In the case when the buried layer 324 and well 328 are insulators, no bias condition is established when the material in the buried layer 324 is silicon dioxide, diamond, or quartz. In some embodiments, the well 328 can abut or extend beyond the buried layer 324. Well 328 can be deep trench (DT), or through silicon via (TSV) that extend to the buried layer 324, or extends below the lower edge of the buried layer 324.

In this example, dedicated P+ body ties 301 are added between each pair of adjacent source N+ fingers 303 as discussed above. The P+ body ties 301 and the N+ fingers 303 are formed in the isolated epitaxial region 202. In addition, the N+ well 328 is electrically coupled to the NTUB 330 which is electrically coupled to the bond pad 304 or the ground pad 308.

The body ties 301 are separate from source N+ fingers 303. Each finger 303 includes a gate 315, a source region 317, and a drain region 319 tied to a pad (i.e. I/O pad 204). Thus, the body ties 301 are located between adjacent source regions 317. In this example, the body ties 301 are connected to a body ring 318 using a metallic material. The effective body resistance between each source edge on gate side and the body ring 318 is approximately equal to the effective body resistance between another source edge on gate side and the body ring 318. This effective body resistance is referred to herein and labeled in FIG. 3 as Rf. Thus, the effective resistance between any source edge on gate side and the GND P+ ring 320 is Rb+Rf, where Rb is the resistance between the body ring 318 and the GND P+ ring 320. The GND P+ ring 320 can be coupled to the ground pad 208 in some embodiments. In other embodiments, the GND P+ ring 320 is coupled to a separate ground potential.

The body resistance is, thus, uniformly distributed across different fingers 303 within NMOS semiconductor device 210 and within each individual finger 303. That is, the body resistance is not location dependent. Furthermore, all of the fingers 303 are triggered approximately simultaneously and are turned on with an approximately equal strength due to the uniform distribution of the body resistance.

In addition, all of the fingers 203 reach a failure threshold at approximately the same time due to the uniform distribution of the body resistance. The failure threshold is the point of maximum current that can be shunted without failing. Hence, the modulation device 200 is able to achieve a failure threshold approximately equal to a theoretical maximum failure threshold. The improved failure threshold is due to the fact that the modulation device 200 is not limited to the lower failure threshold of a finger 203 that reaches the failure threshold quicker. In other words, if the body resistance were not distributed uniformly, some fingers would reach a failure threshold quicker. Thus, the failure threshold of the modulation device 200 would be limited by the early failure threshold of one of the fingers 203. However, by distributing the body resistance approximately uniformly, all of the fingers 203 share the load approximately evenly and reach the failure threshold at approximately the same point in time which in turn increases the total failure threshold of the modulation device 200.

Furthermore, due to uniform body current flow, the effective body resistance of MO 202 is reduced, as compared to a modulation device without uniform body current flow, and the holding voltage, Vsp, is raised which enables more operation head room. The trigger voltage Vt1 can be separately tuned with Rtrig and Ctrig with minimal to no impact on Vsp.

Figure 4:
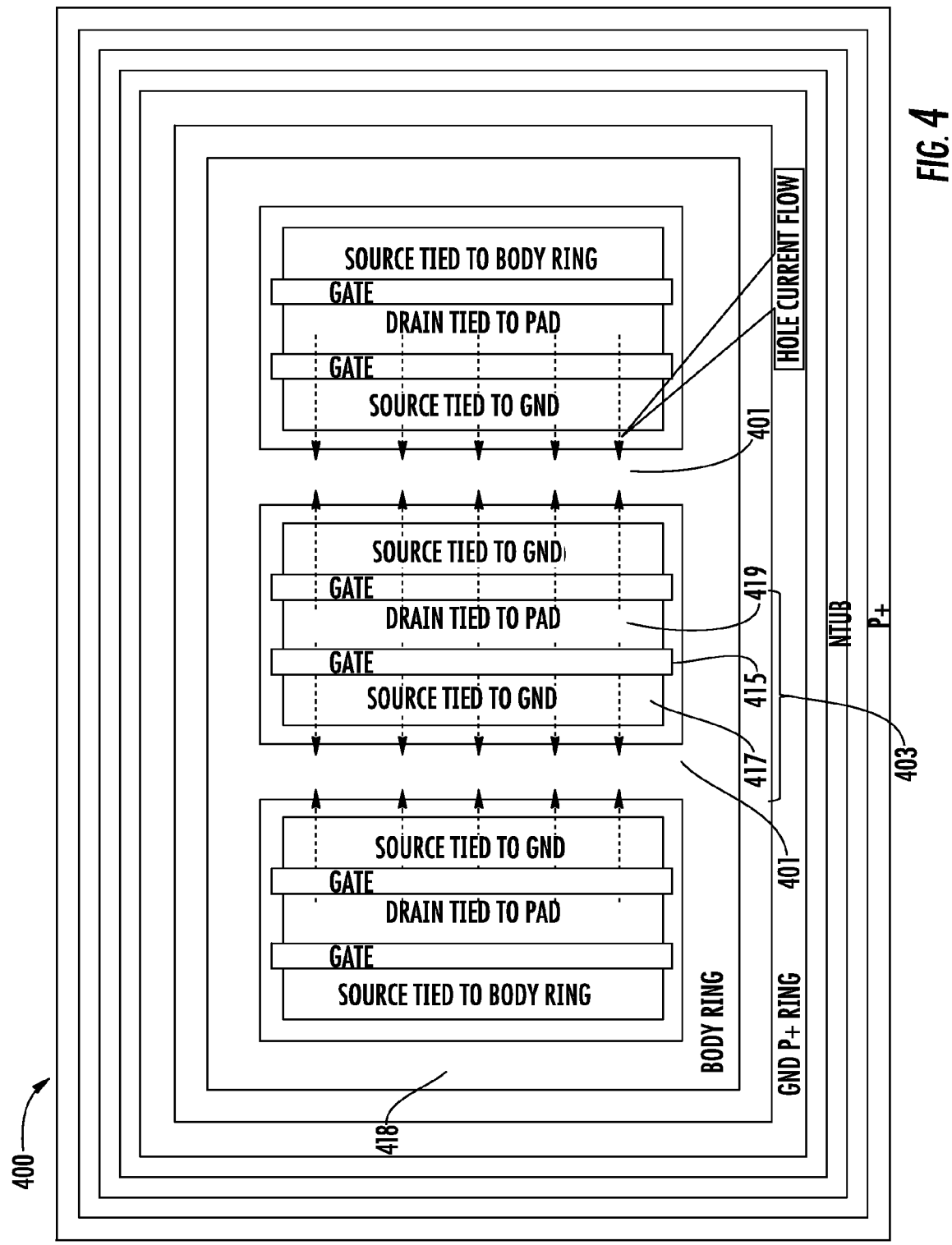
FIG. 4 is a simplified cross section of one embodiment of an isolated epitaxial modulation device.

FIG. 4 is a top view of the exemplary isolated epitaxial modulation device 200. As can be seen in FIG. 4, the body ring 418 includes a plurality of body ties 401 located between adjacent source regions of fingers 403. As further shown in FIG. 4, the effective body resistance between each source edge on gate side and the body ring 418 is approximately equal to the effective body resistance between another source edge on gate side and the body ring 418.

Figure 5:
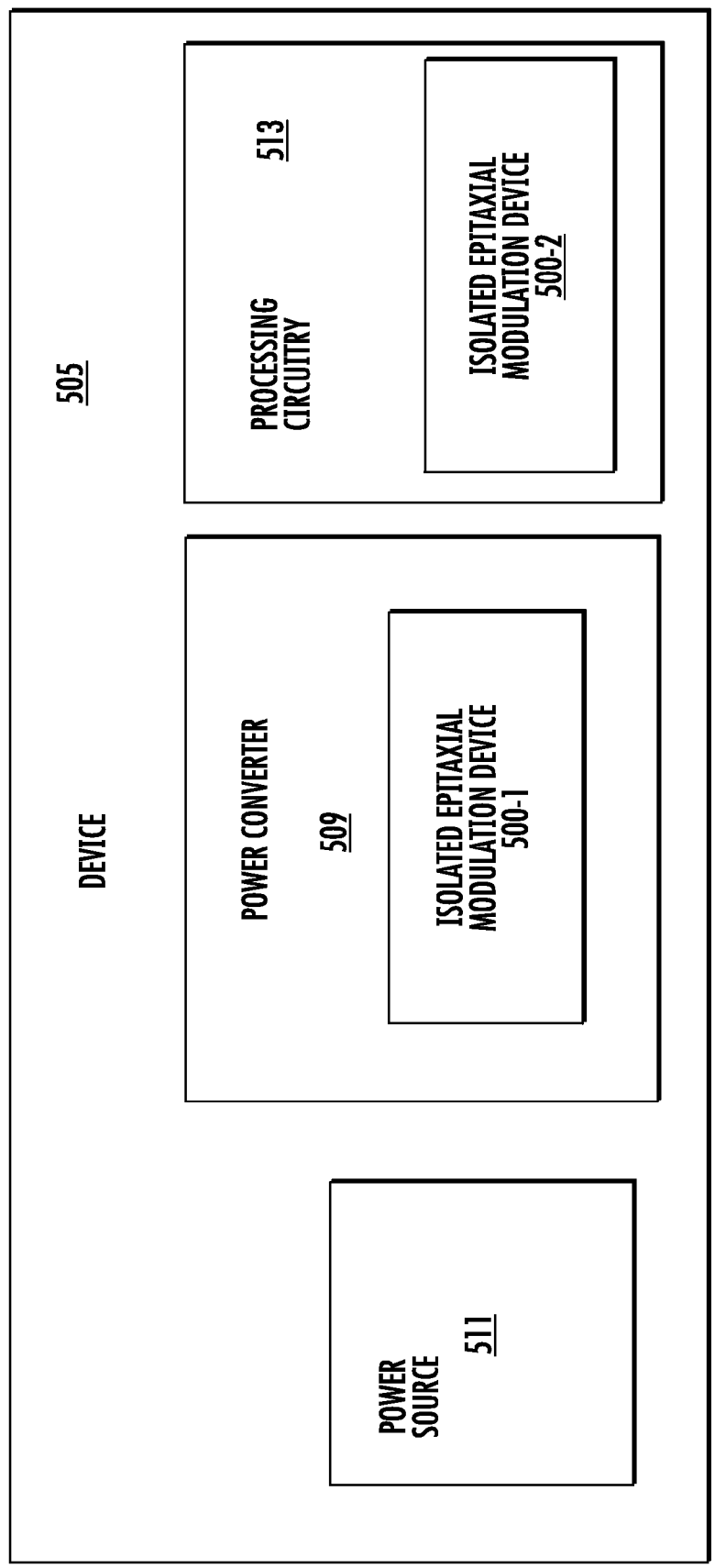
FIG. 5 is a high level block diagram depicting one embodiment of a system comprising at least one exemplary isolated epitaxial modulation device.

The embodiments of an isolated epitaxial modulation device described herein can be used in any integrated circuit or device, for example, to protect the input/output pins from ESD current. For example, FIG. 5 is a high level block diagram depicting an exemplary system 505 comprising at least one isolated epitaxial modulation device 500. The system 505 comprises a power converter 509 coupled to a power source 511 and processing circuitry 513.

In the exemplary embodiment shown in FIG. 5, the power converter 509 incorporates at least one isolated epitaxial modulation device 500-1 as described above. The power converter 509 is coupled to the power source 511 and is configured to convert the power received from the power source to a level and polarity usable by the processing circuitry 513. For example, the power converter 509 can be implemented as a direct current (DC) to direct current converter to lower or raise the voltage level of the power received from the power source 511 to a level required by the processing circuitry 513. Alternatively, the power converter 509 can be implemented as an alternating current (AC) to direct current (DC) converter.

Additionally, in some embodiments, the power converter 509 is a high-current and high-voltage power converter. However, embodiments of the isolated epitaxial modulation devices described herein can be implemented in other power devices, high-power density and high-efficiency DC power converters, and high voltage AC/DC power converters. For example, the isolated epitaxial modulation device can be implemented in an off-chip driver.

In one embodiment, the power source 511 is external to the device 505. For example, the power source 511 can be mains power coupled to the device 505 via an electrical socket. In other embodiments, the power source 511 can be internal to the device 505, such as a battery.

In addition, in this embodiment, the processing circuitry 513 also includes at least one isolated epitaxial modulation device 500-2 which protects the input/output pins of circuits in the processing circuitry 513. The processing circuitry 513 and the isolated epitaxial modulation device 500-2 can be implemented in a single monolithic integrated circuit or in co-packaged devices containing separate die.

The device 505 can be implemented as any electronic device, such as a cell phone, computer, navigation device, microprocessor, a high frequency device, etc. Hence, the implementation of the processing circuitry is dependent on the particular device. For example, when device 505 is implemented as a cell phone, the processing circuitry 513 can include a digital signal processor (DSP), analog-to-digital (ADC) converters, radio frequency transmission and reception amplifiers, memory circuits, and a microprocessor, as known to one of skill in the art. The isolated epitaxial modulation device 500-2 is configured to protect the processing circuitry 513 from voltage and/or current spikes, such as electrostatic discharge (ESD) current.

Figure 6:
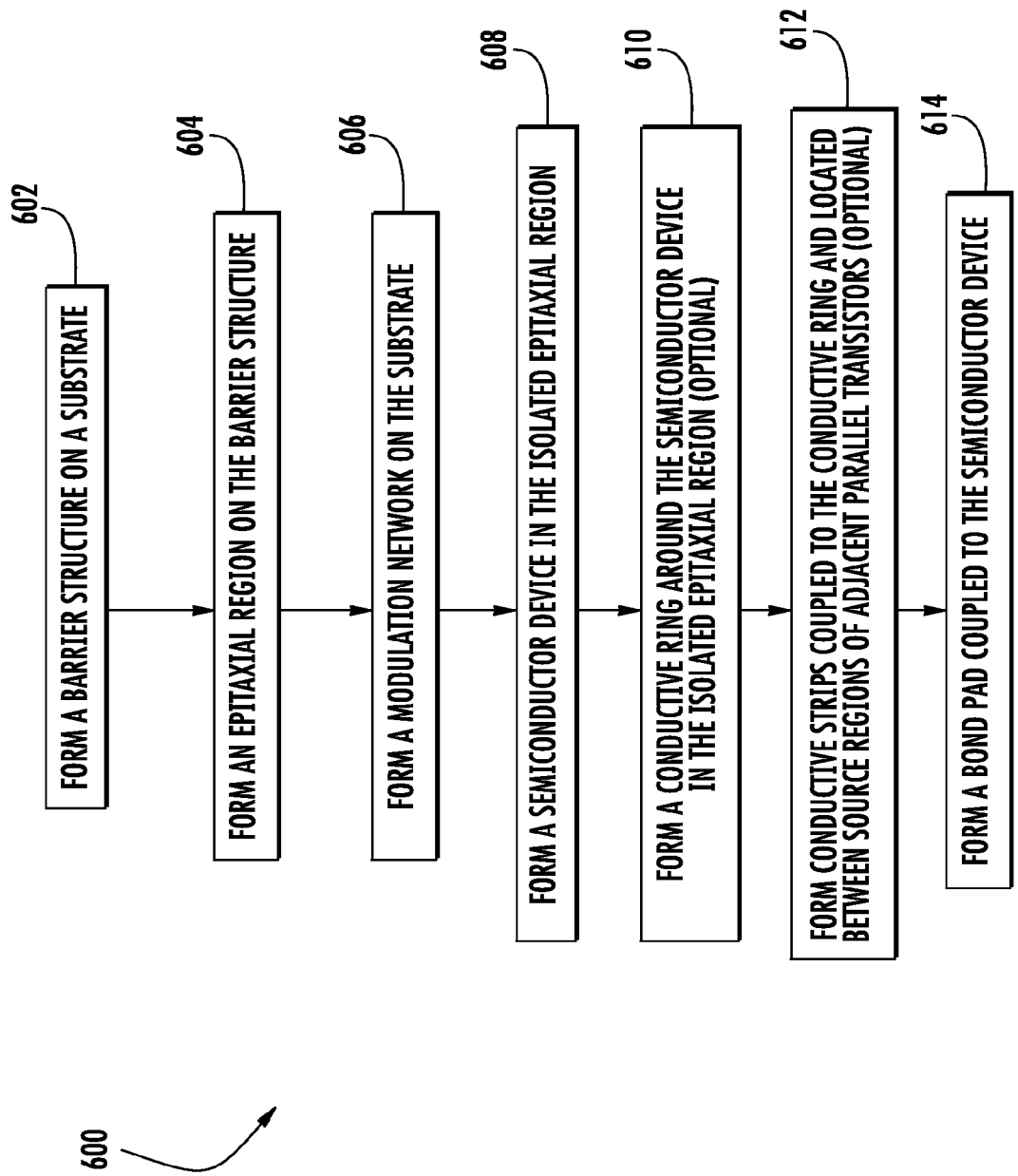
FIG. 6 is a flow chart depicting one embodiment of a method of manufacturing an isolated epitaxial modulation device.

FIG. 6 is a flow chart depicting an exemplary method of manufacturing an isolated epitaxial modulation device, such as the exemplary isolated epitaxial modulation devices described above. At block 602, a barrier structure is formed on a substrate. For example, in some embodiments, a biased buried layer is formed on the substrate. At block 604, an epitaxial region is formed on the barrier structure using techniques know to one of skill in the art. The barrier structure encloses and electrically isolates the epitaxial region from the substrate.

At block 606, a modulation network is formed on the substrate. For example, a resistor, capacitor, and transistor can be formed using techniques known to one of skill in the art. At block 608, a semiconductor device, such as the exemplary semiconductor devices having a plurality of parallel transistors discussed above, is formed in the isolated epitaxial region using techniques known to one of skill in the art. The semiconductor device is coupled to the modulation network. In embodiments implementing a semiconductor device that has a plurality of parallel transistors, the method 600 optionally includes forming a conductive ring in the isolated epitaxial region at block 610. The conductive ring surrounds the plurality of parallel transistors. In such embodiments, method 600 also optionally includes forming a plurality of conductive strips coupled to the conductive ring at block 612. Each of the plurality of conductive strips is formed between adjacent source regions of the plurality of parallel transistors. At block 614, a bond pad is formed on the device. The bond pad can be a signal pad or a power pad. The bond pad is electrically coupled to the semiconductor device in the isolated epitaxial region.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method of manufacturing an isolated epitaxial modulation device, the method comprising:
    forming a barrier structure on a substrate;
    forming an isolated epitaxial region on the barrier structure;
    forming a semiconductor device in the isolated epitaxial region;
    forming a modulation network on the substrate, the modulation network coupled to the semiconductor device;
    forming a bond pad, the bond pad electrically coupled to the semiconductor device in the isolated epitaxial region.

2. The method of claim 1, wherein forming a bond pad comprises forming one of a signal pad and a power pad.

3. The method of claim 1, wherein forming a barrier structure comprises;
    forming a biased buried layer; and
    forming a biased well coupled to the biased buried layer to enclose the isolated epitaxial region.

4. The method of claim 1, wherein forming a semiconductor device in the isolated epitaxial region comprises forming a plurality of parallel transistors.

5. The method of claim 4, the method further comprising:
    forming a conductive ring in the isolated epitaxial region, the conductive ring surrounding the plurality of parallel transistors; and
    forming a plurality of conductive strips coupled to the conductive ring, each conductive strip formed between adjacent source regions of the plurality of parallel transistors.

6. The method of claim 5, further comprising:
forming a ground ring surrounding and coupled to the conductive ring in the isolated epitaxial region.

7. The method of claim 1, further comprising:
forming a ground pad; and
electrically coupling the isolated epitaxial region to at least one of the bond pad and the ground pad;
wherein the semiconductor device and the epitaxial modulation network are configured to modulate an input voltage.

8. The method of claim 1, wherein forming the semiconductor device comprises forming one of a metal oxide semiconductor field-effect transistor (MOSFET), a bipolar junction transistor (BJT), and a laterally diffused metal oxide semiconductor (LDMOS) device.

9. The method of claim 1, wherein forming the modulation network comprises forming a resistor-capacitor (RC) discriminator and a transistor.

10. The method of claim 3, wherein forming the biased well comprises forming one of a silicon metallurgical junction structure, shallow trench isolation (STI) structure, deep trench (DT) structure, through wafer via (TWV) structure, or through silicon vias (TSV) structure.

11. A method of manufacturing an integrated circuit, the method comprising:
forming processing circuitry on a substrate;
forming a barrier structure on the substrate;
forming an isolated epitaxial region on the barrier structure, the barrier structure electrically isolating the isolated epitaxial region from the substrate;
forming a semiconductor device, the semiconductor device located in the isolated epitaxial region;
forming a modulation network on the substrate; the modulation network electrically coupled to the semiconductor device; and
forming a bond pad electrically coupled to the isolated epitaxial region;
wherein the semiconductor device and the epitaxial modulation network are configured to protect the processing circuitry from current spikes.

12. The method of claim 11, wherein forming the semiconductor device comprises:
forming a multi-finger n-channel metal oxide semiconductor (NMOS), each of the fingers comprising a gate, a drain region and a source region.

13. The method of claim 12, further comprising:
forming a conductive structure in the isolated epitaxial region, the conductive structure coupled to a ground potential and comprising:
a conductive ring surrounding the semiconductor device; and
a plurality of conductive strips coupled to the conductive ring, each conductive strip located between adjacent source regions of the plurality of fingers.

14. The method of claim 11, further comprising forming a ground pad, the ground pad electrically coupled to the isolated epitaxial region.

15. The method of claim 11, wherein forming the modulation network comprises forming a resistor, a capacitor, and a transistor.

16. The method of claim 15, wherein forming the transistor comprises coupling the transistor between the bond pad and a ground potential.

* * * * *